US010198545B1

(12) United States Patent
Tan et al.

(10) Patent No.: US 10,198,545 B1
(45) Date of Patent: Feb. 5, 2019

(54) SYSTEMS AND METHODS FOR EXTRACTION OF ELECTRICAL SPECIFICATIONS FROM PRELAYOUT SIMULATIONS

(71) Applicant: Altera Corporation, San Jose, CA (US)

(72) Inventors: Tat Hin Tan, Bayan Lepas (MY); Kian Boon How, Bayan Baru (MY); Chieu Fung Tan, Bukit Mertajam (MY); My Chien Yee, Port Dickson (MY)

(73) Assignee: ALTERA CORPORATION, San Jose, CA (US)

( * ) Notice: Subject to any disclaimer, the term of this patent is extended or adjusted under 35 U.S.C. 154(b) by 59 days.

(21) Appl. No.: 15/276,412

(22) Filed: Sep. 26, 2016

(51) Int. Cl.
*G06F 17/50* (2006.01)

(52) U.S. Cl.
CPC ...... *G06F 17/5072* (2013.01); *G06F 17/5081* (2013.01)

(58) Field of Classification Search
CPC .............. G06F 17/5081; G06F 17/505; G06F 17/5068; G06F 2217/74; G06F 17/11; G06F 17/5018; G06F 17/5036; G06F 2217/16
See application file for complete search history.

(56) References Cited

U.S. PATENT DOCUMENTS

| 2014/0007031 A1* | 1/2014 | Huang | G06F 17/5036 716/112 |
| 2015/0254389 A1* | 9/2015 | Lee | G06F 17/5081 716/112 |

* cited by examiner

*Primary Examiner* — Vuthe Siek
(74) *Attorney, Agent, or Firm* — Fletcher Yoder, P.C.

(57) ABSTRACT

Systems and methods for extracting one or more electrical specifications from a prelayout simulation of an integrated circuit design, where the one or more electrical specification are utilized to generate a physical layout of one or more components of an integrated circuit.

20 Claims, 20 Drawing Sheets

SYSTEMS AND METHODS FOR EXTRACTION OF ELECTRICAL SPECIFICATIONS FROM PRELAYOUT SIMULATIONS

BACKGROUND

The present disclosure relates generally to design methodologies involving integrated circuits (e.g., field programmable gate arrays (FPGAs), microprocessors, system-on-chips (SOCs), etc.). More particularly, the present disclosure relates to systems and methods for extracting electrical specifications from prelayout simulations.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

Over the course of developing ICs (e.g., FPGAs, CPUs, SOCs, etc.), the designer may engage in one or more cycles of design iterations. For instance, the designer may consider various parameters and dimensions when determining a physical configuration of the components (e.g., logic blocks, circuitry, process nodes, etc.). In certain situations, unexpected reliability concerns (e.g., electromigration, electrical parasitics, self-heating, etc.) arising during the design process may result in unforecasted cycles of design iterations. One way to address these design challenges is to provide electrical specification information to the designer earlier within the design process. However, it may be difficult and time-consuming to gather and provide electrical specification information to the designer earlier within the design process.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems and methods for extracting one or more electrical specifications (e.g., resistance specifications, capacitance specifications, summed current specifications, etc.) from a prelayout simulation of an integrated circuit design. In certain embodiments, the one or more electrical specification are utilized to generate a physical layout of one or more components of an integrated circuit. For example, in certain embodiments, the extracted electrical specification information may be utilized to generate a feasible floorplan, and may address postlayout resistance and capacitance considerations and reliability considerations (e.g., electromigration, self-heating, etc.) earlier within the design process.

BRIEF DESCRIPTION OF THE DRAWINGS

Advantages of the disclosure may become apparent upon reading the following detailed description and upon reference to the drawings in which.

DETAILED DESCRIPTION OF SPECIFIC EMBODIMENTS

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure generally relate to extracting electrical specification information from prelayout simulations. As noted above, a designer (e.g., layout designer) may be confronted with unexpected reliability concerns (e.g., electromigration, electrical parasitics, self-heating, etc.) over the course of a silicon design process. In particular, these unexpected reliability concerns may lead to one or more unforecasted cycles of design iterations, which may cause unexpected delays in the production of Integrated Circuits (ICs). Accordingly, it may be beneficial to provide electrical specification information (e.g., average current consumption, resistance requirements, etc.) to the layout designer earlier within the design process. Indeed, such electrical specification information may help guide the layout designer so that various physical components (e.g., circuit blocks, wiring width, wiring length, number of wire tracks, routing layer, wiring tracks, etc.) of the ICs are budgeted for and considered earlier within the design process.

Accordingly, the disclosed embodiments are directed to reducing cycles of design iterations during a layout design phase by extracting electrical specification information from prelayout simulations of a circuit design phase. In this manner, a layout designer may receive electrical specifications needed to guide the design of a floorplan and/or a routing of an IC without having to derive this information through a trial and error basis. Furthermore, the electrical specification information may be extracted during prelayout simulations, so that the electrical specification information may be automatically extracted without laborious effort from the designer.

Figure 1:
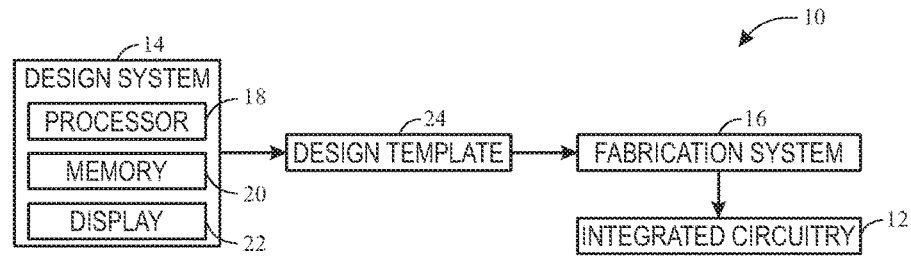
FIG. 1 is a block diagram of a system that utilizes prelayout simulations to extract electrical specification information, in accordance with an embodiment.

With the foregoing in mind, FIG. 1 is a block diagram of a system 10 that extracts electrical specification information from prelayout simulations to fabricate integrated circuitry 12 (e.g., a FPGA, microprocessors, system-on-chips (SOCs), etc.), in accordance with an embodiment. Specifically, the system 10 includes a design system 14 and a fabrication system 16. In certain embodiments, the design system 14 may include a processor 18 coupled to a memory 20 and a display 22. The memory 20 may store one or more algorithms for deriving the electrical specification information from prelayout simulations. In certain embodiments, the one or more algorithms for deriving the electrical specification information may include methodology related to Spice-based Prelayout Extraction and Annotation of Reliability Verification (RV) and Resistance/Capacitance (RC) requirements (e.g., SPEAR). Specifically, one or more algorithms stored on the memory 20 may be executed by the processor 18 to extract electrical specification information, such as, for example, resistance and capacitance specifications (e.g., pin capacitance specifications, pin resistance specifications, net resistance specifications, etc.). Furthermore, in certain embodiments, the processor 18 may be configured to extract electrical specification information related to the summed current (e.g., net currents, pin currents, etc.).

In certain embodiments, the extracted electrical specification information may be utilized to generate a feasible floorplan, and may address postlayout resistance and capacitance considerations and reliability considerations (e.g., electromigration, self-heating, etc.) earlier within the design process. In particular, the design system 12 may be configured to automate the extraction of electrical specification information, thereby relieving a circuit designer from manually annotating and/or computing the electrical specification information for the layout process. In certain embodiments, the design system 12 and/or the layout designer may utilize this extracted information to generate an electronic design (e.g., design template 24). The design template 24 may be utilized by the fabrication system 16 to create the integrated circuitry 12.

Figure 2:
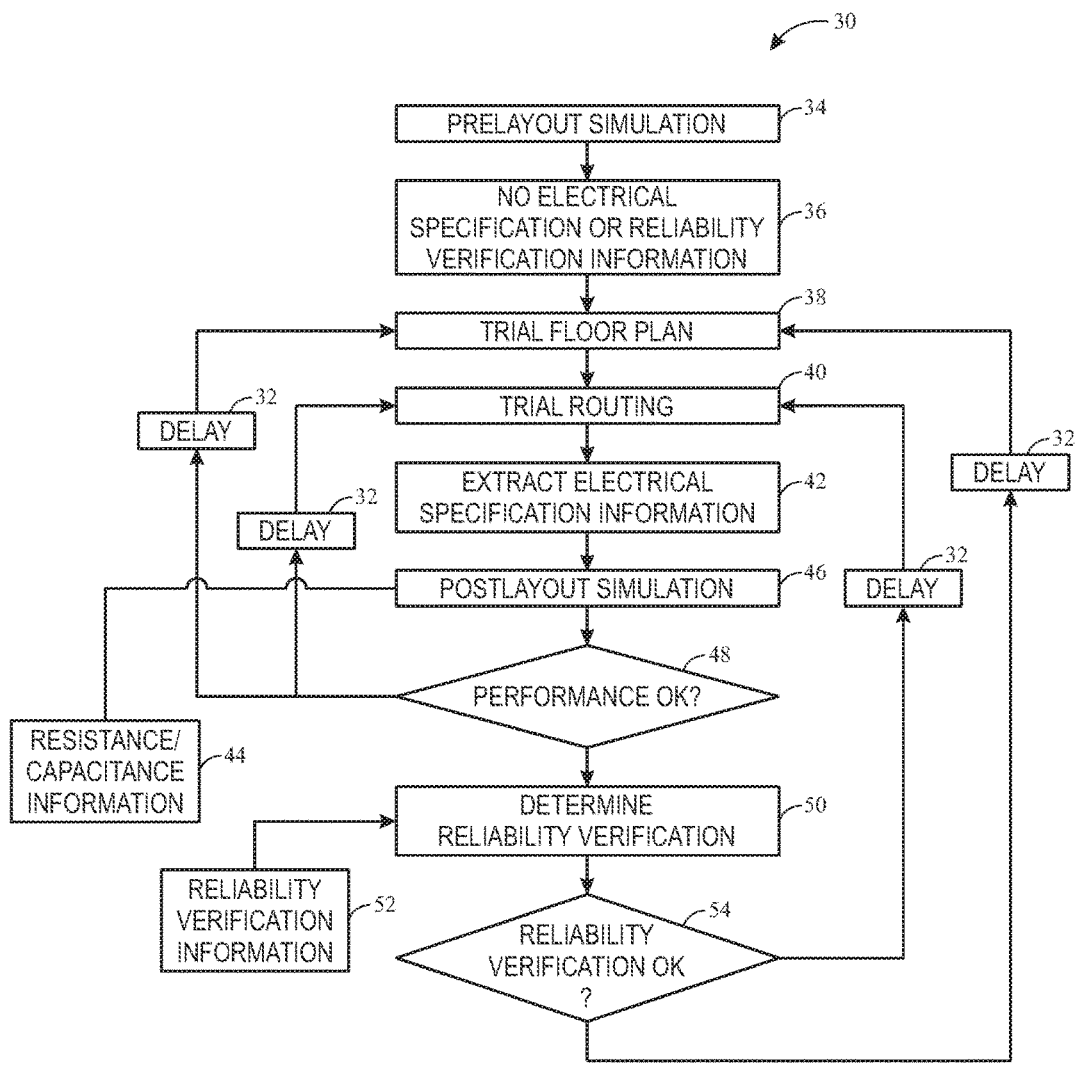
FIG. 2 is a flowchart depicting a design process that results in unforecasted cycles of design iterations, in accordance with an embodiment.

FIG. 2 is a flowchart depicting a design process 30 that may result in unforecasted cycles of design iterations, thereby causing time delay 32. In particular, without the disclosed embodiments, the design process 30 for developing the IC may result in one or more unforecasted cycles of design iterations, which may cause the time delay 32. Specifically, without the disclosed embodiments, the design process 30 may include a prelayout simulation (block 34) that does not extract electrical specification information (e.g., resistance, capacitance, summed current information) and/or reliability verification information (block 36). Accordingly, in such embodiments, a designer (e.g., layout designer) may not have information that would otherwise help guide the design of a floorplan and/or a routing of wires. Indeed, without the disclosed embodiments, floorplan and routing considerations may be determined with a trial and error basis.

For example, in some situations, without the disclosed embodiments, the design process 30 may include a trial floorplan (block 38) and a trial routing (block 40), which may be utilized to extract electrical specification information (block 42), such as resistance and capacitance information 44. The design process 30 without the disclosed embodiments may include utilizing the extracted electrical specification information for a postlayout simulation (block 46). Further, this design process 30 may utilize the extracted resistance and capacitance information 44 to determine if the performance of the IC is acceptable (block 48). In some situations, the trial floorplan and the trial routing may be unacceptable, and may result in poor performance. Accordingly, without the disclosed embodiments, the design process 30 may include additional cycles of design iterations (e.g., the time delay 32), where the trial floorplan (block 38) and/or the trial routing (block 40) may be reconsidered.

In some situations, the trial floorplan and the trial routing may be acceptable, and the design process 30 without the disclosed embodiments may determine reliability verification information (block 50) for electromigration considerations and/or self-heating considerations. Further, this design process 30 may determine if the determined reliability verification information 52 is acceptable (block 54). In some situations, the reliability verification information 52 may be unacceptable, and may result in additional cycles of design iterations (e.g., the time delay 32), where the trial floorplan (block 38) and/or the trial routing (block 40) may be reconsidered. In particular, without the disclosed embodiments, the design process 30 may include time delays 32 lasting from a few days to a few months. Indeed, the time delay 32, which may correspond to a number of unforecasted cycles of design iterations, may be greater the further along the design process 30. Accordingly, as further described with respect to FIG. 3, it may be beneficial to provide for systems and methods for automated extraction of electrical specifications, which may be utilized to guide a floorplan and/or a routing without having to derive this information through a trial and error basis.

Figure 3:
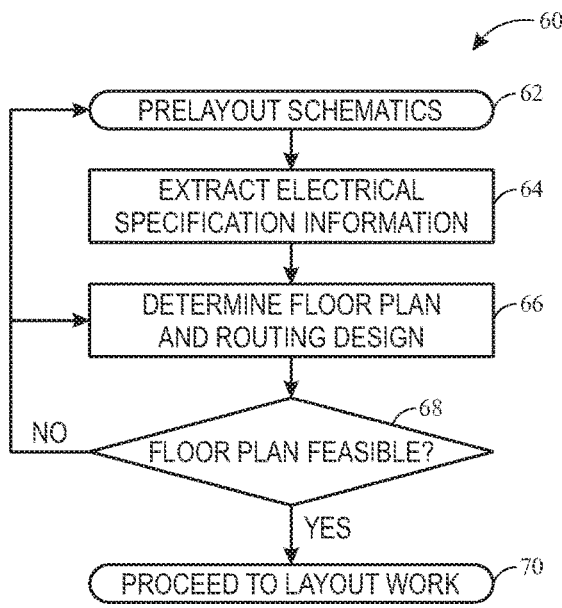
FIG. 3 is a flowchart depicting a design process for extracting electrical specification information from prelayout simulations, in accordance with an embodiment.

FIG. 3 is a flowchart depicting a design process 60 for extracting electrical specification information 44 from prelayout simulations, in accordance with the disclosed embodiments. Specifically, the design process 60 of the disclosed embodiments may include prelayout schematics (block 62) that are simulated by the processor 18. Specifically, the design process 60 may include extracting electrical specification information (block 64) from prelayout simulations. In certain embodiments, the extracted electrical information may include computing resistance and capacitance specifications. Further, in certain embodiments, the extracted electrical information may include average/rms/peak current specifications. Indeed, in certain embodiments, the processor 18 may be configured to execute one or more algorithms to relieve a designer (e.g., circuit designer) from manually annotating average/rms/peak current specifications and computing resistance and capacitance specifications.

In particular, the extracted electrical information may be processed and utilized to generate a floorplan (block 66) that addresses various postlayout resistance and capacitance considerations and reliability requirements. For example, in certain embodiments, a designer (e.g., layout designer) may utilize the extracted information to determine a feasible floorplan and calculate metal tract requirements for critical nets and/or pins. In certain embodiments, the design process 60 may determine if the generated floorplan is feasible (block 68), and may proceed to layout work if the floorplan is feasible (block 70). In some situations, if the floorplan is not feasible, the design process 60 includes reconsideration of the floorplan and/or routing design (block 66). In this manner, the disclosed embodiments may avoid the time delays 32 (e.g., unforecasted cycles of design iterations) that may delay the design process 30.

With the foregoing in mind, FIGS. 4-26 further describe one or more techniques (e.g., methods and/or algorithms) for deriving electrical specification information (e.g., summed currents, resistance, and capacitance specifications, etc.) from prelayout simulations.

Figure 4:
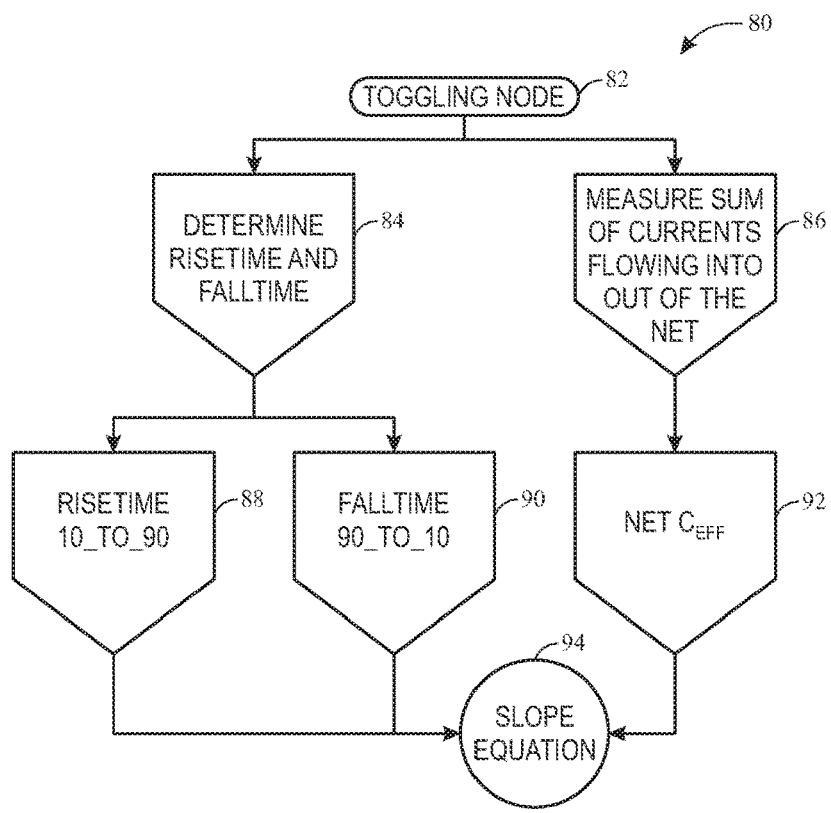
FIG. 4 is a flowchart depicting a process for determining a resistance specification for a toggling node, in accordance with an embodiment.

FIG. 4 is a flowchart of a process 80 for determining a resistance specification for a toggling node (e.g., toggling waveform). In certain embodiments, the processor 18 may implement the process 80 to determine the resistance specification for a toggling node (block 82). In certain embodiments, the process 80 may include determining a slope risetime and a slope falltime (block 84) and measuring a sum of currents flowing into and out of the net (block 86). For example, the process 80 may include determining a slope risetime (block 88) by determining the time taken for the signal to traverse from the 10% point to the 90% point of a toggling waveform. As a further example, the process 80 may include determining a slope falltime (block 90) by determining the time taken for the signal to traverse from the 90% point to the 10% point of a toggling waveform. In certain embodiments, the process 80 may include calculating a net effective capacitance (block 92). Further, the process 80 may include utilizing the calculated slope risetime (block 88), the slope falltime (block 90), and the net effective capacitance (block 92) within a slope equation (block 94), as further described with respect to FIG. 5.

Figure 5:
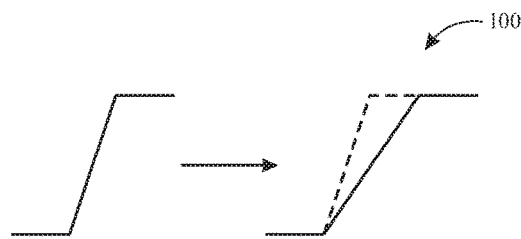
FIG. 5 is an illustration of a slope-based technique for determining a resistance specification for a toggling node (or net), in accordance with an embodiment.

FIG. 5 is an illustration of a slope-based technique 100 for determining a resistance specification for a toggling node, in accordance with an embodiment. In certain embodiments, high speed critical paths are often inspected for their slopes. For example, it may be beneficial to have risetimes/falltimes of clock signals to be less than a user defined requirement (e.g., less than 20%, less than 30%, less than 40%, etc.) of the clock period. Indeed, if the layout is not designed properly, the slopes may be degraded beyond the allowed requirement. Accordingly, it may be beneficial to specify the maximum wiring resistance in advance to avoid degradation of the slopes beyond the allowed requirement.

In certain embodiments, to derive the resistance, the toggling waveform may be approximated in the first order by a classic linear RC (e.g., resistance/capacitance) exponential equation. When the togging node is being charge, the equation may be expressed as:

$$1 - e^{-\frac{t}{RC}} \quad \text{(Equation 1)}$$

As noted above, the slope risetime may be defined as the time taken for the signal to traverse from the 10% point to the 90% point of a toggling waveform. The 10% point and the 90% point may be related numerically to the exponential waveform by the following equations:

$$0.1 = 1 - e^{-0.10536} \quad \text{(Equation 2)}$$

$$0.9 = 1 - e^{-2.30259} \quad \text{(Equation 3)}$$

Indeed, this may lead to a relation between RC to the 10% and 20% points as described below:

$$t_{10}/RC = -0.10536 \quad \text{(Equation 4)}$$

$$t_{90}/RC = -2.30259 \quad \text{(Equation 5)}$$

Accordingly, combining the above noted equations for a design in prelayout stage (e.g., the resistance and the capacitance would not have any metal wiring contribution), would yield:

$$\frac{\Delta t_{10to90}}{R_{nonwire}C_{nonwire}} = 2.197 \quad \text{(Equation 6)}$$

Furthermore, after accounting for the postlayout wiring, the equation may be described as:

$$\frac{\Delta t_{10to90\_degraded}}{(R_{nonwire} + R_{wire})(C_{nonwire} + C_{wire})} = 2.197 \quad \text{(Equation 7)}$$

In particular, $C_{gb}$ may be the user defined capacitance guardband percentage/ratio (e.g., the guardband for prelayout to postlayout ratio for the node capacitance), and may be described as:

$$C_{nonwire} + C_{wire} = (1 + C_{gb})C_{non\_wire} \quad \text{(Equation 8)}$$

Further, $\Delta t_{10to90degraded}$ may be the degraded risetime or falltime, and may be described as:

$$\Delta t_{10to90degraded} = (1 + \Delta t_{gb})\Delta t_{10to90} \quad \text{(Equation 9)}$$

In Equation 9, $\Delta t_{gb}$ may be the postlayout slope degradation ratio guardband (i.e., if the user specifies a $\Delta t_{gb}$ of 0.2 for a prelayout risetime of 100 ps, that would mean that the postlayout risetime is allowed to degrade to 120 ps. Accordingly, this may lead to the final slope equation (block 94), which may be utilized to determine a resistance specification for a toggling node:

$$R_{wire\_stops} = \frac{(\Delta t_{gb} - C_{gb})\Delta t_{10to90}}{2.197C(1 + C_{gb})} \quad \text{(Equation 10)}$$

It should be noted that transistor driven nodes may not follow a simple RC charging and/or discharging waveform, as the transistor may follow a non-linear electrical behavior. To help compensate for the degraded turn-on time of the transistor, the value of $R_{wire}$ specified may be more stringent than required. In this manner, $R_{wire}$ may be computed by looking at signal slope only for a toggling waveform.

Figure 6:
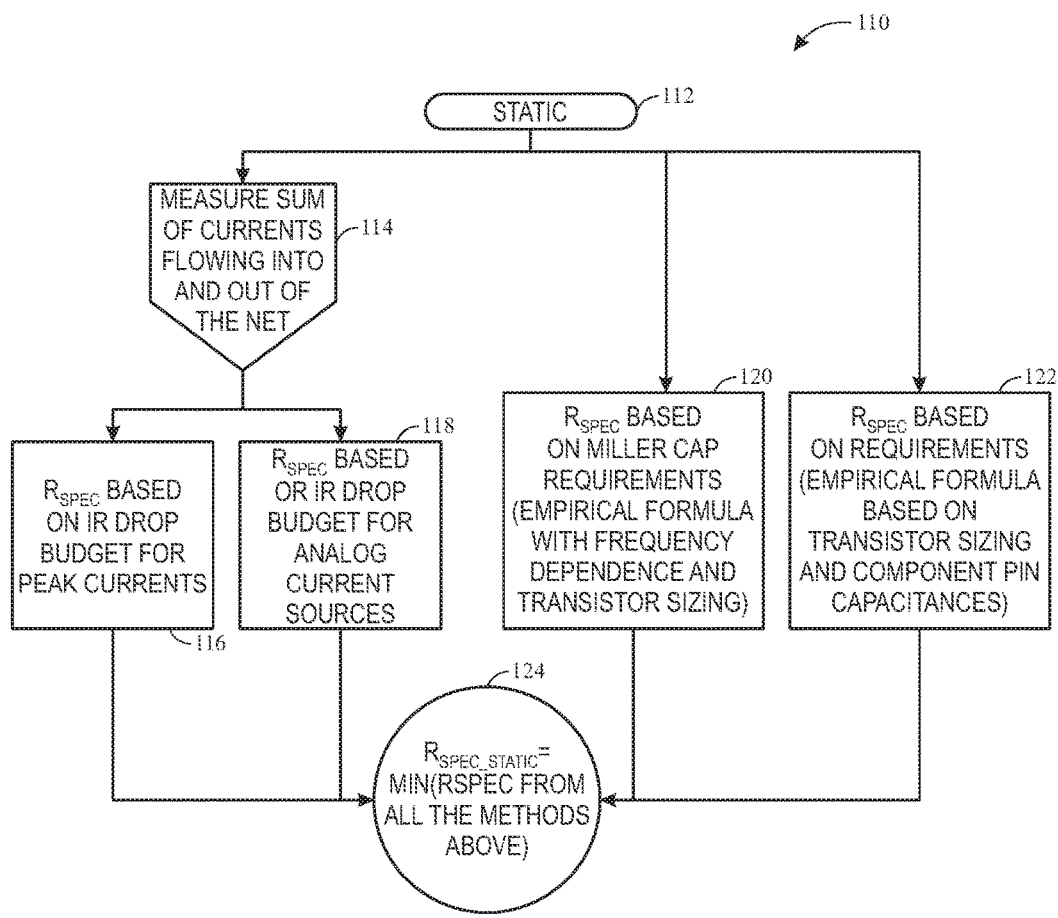
FIG. 6 is a flowchart depicting a process for determining a resistance specification for a static node (or net), in accordance with an embodiment.

FIG. 6 is a flowchart depicting a process 110 for determining a resistance specification for a static node, in accordance with an embodiment. In certain embodiments, the processor 18 may implement the process 110 to determine the resistance specification for a static node (block 112). In certain embodiments, the process 110 may include measuring a sum of currents flowing into and out of the net (block 114). For example, the process 110 may include determining a Rspec (resistance specification) based on IR drop budget for peak currents (block 116) and determining a Rspec (resistance specification) based on IR drop budget for analog current sources (block 118).

Furthermore, in certain embodiments, the process 110 may include determining Rspec (resistance specification) based on Miller cap requirements (e.g., empirical formula with frequency dependence and transistor sizing) (block 120). Additionally, in certain embodiments, the process 110 may include determining Rspec (resistance specification) based on fanout requirements (e.g., empirical formula based on transistor sizing and component pin capacitances).

Accordingly, in certain embodiments, the process 110 may determine a net resistance specification (block 124) for static nodes based on the determined Rspec for each of the methods described above (e.g., block 116, 118, 120, and 122), as further described with respect to FIGS. 7-11.

Figure 7:
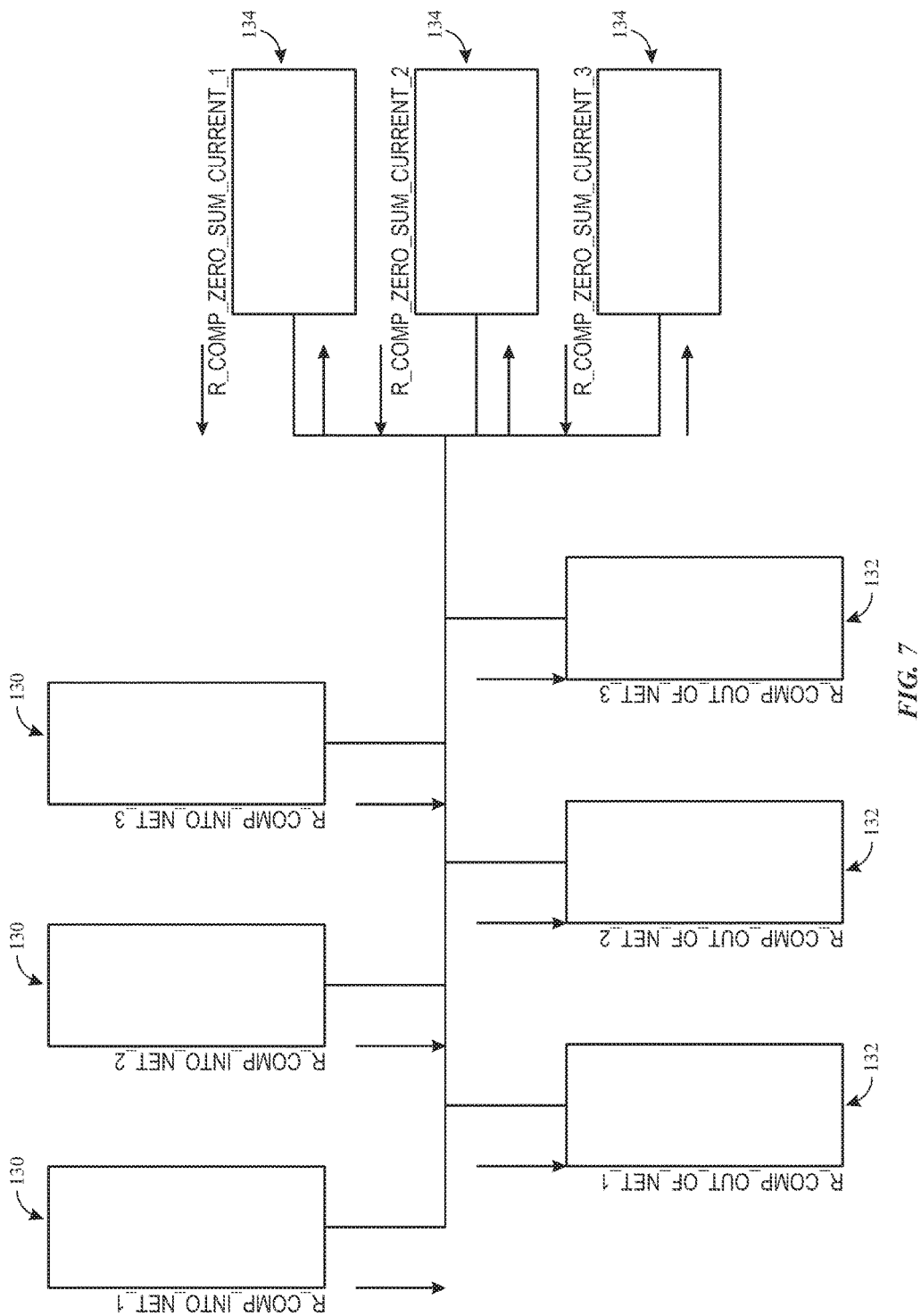
FIG. 7 is an illustration of a technique for determining a resistance specification for a static node (or net) with components having predetermined resistances, in accordance with an embodiment.

FIG. 7 is an illustration of a technique for determining a resistance specification for a static node, in accordance with an embodiment. In certain embodiments, it may be beneficial to compute the wiring resistance specification for each component attached to a net, because each component may require a different wire resistance computation. Accordingly, the resistance specification for a static node may be a single value derived from the wiring resistance requirements for each component attached to the net.

In certain embodiments, the components attached to the net may be grouped into three different categories: (i) those with pin current flowing into the node/net 130 (e.g., R_comp_into_net_1, R_comp_into_net_2, R_comp_into_net_3, etc.), (ii) those with pin currents flowing out of the node/net 132 (e.g., R_comp_out_of_net_1, R_comp_out_of_net_2, R_comp_out_of_net_3, etc.), and (iii) those with ac component current flow and zero dc current flowing into/out of the node/net 134 (e.g., R_comp_zero_sum_current_1, R_comp_zero_sum_current_2, R_comp_zero_sum_current_3, etc.). In certain embodiments, to cater for small0signal AC performance requirements, tapping or attaching a port into the middle of the wire would provide an effective $R_{wire}/2$ resistance for a small-signal equivalent topology.

Accordingly, the resistance specification for the static net can be described with the equation:

$$R_{wire\_static} = \min\left(\sum_i \| R_{wire\_static\_out\_of\_net\_i}, \sum_i \| R_{wire\_static\_into\_net\_i}, \sum_i \| R_{wire\_static\_component\_with\_zero\_one\_current\_i}\right)$$

Figure 8:
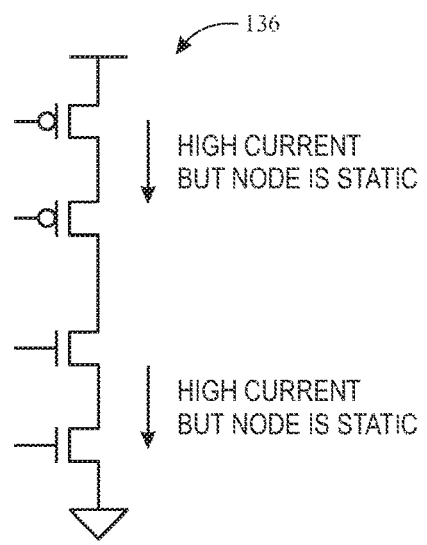
FIG. 8 is an illustration of a technique for determining a resistance specification for a static node (or net) with high current flow, in accordance with an embodiment.

FIG. 8 is an illustration of a technique 136 for determining a resistance specification for a static node with high current flow, in accordance with an embodiment. In certain embodiments, for static nodes in internal nodes between stacked transistors, it may be beneficial to minimize the performance disparity between prelayout and postlayout simulations due to Vgs degradation. In particular, to identify such nodes/nets, the processor 18 may be configured to identify nodes having small voltage swings, approximately less than 0.2-0.3V. Accordingly, if the design engineer were to specify an allowable IR drop limit of 50 mV for this node/net, then the wiring resistance is given by 50 mV/Ipeak of sum of curents flowingot net or 50 mV/Ipeak of sum of currents flowing out of net. Typically, the IR drop limit for such nodes is more relaxed than the limit for the current source nodes.

Figure 9:
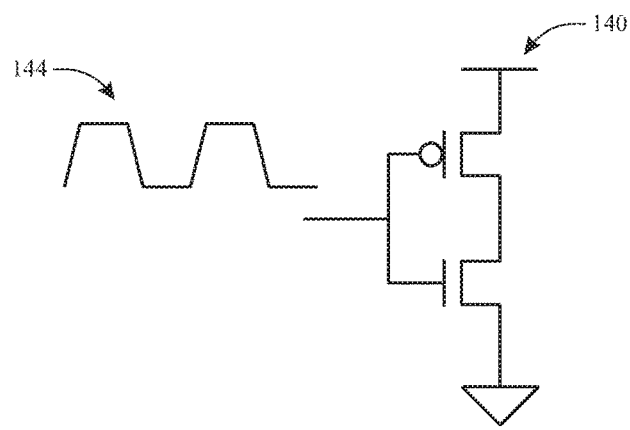
FIG. 9 is an illustration of a technique for determining a resistance specification for a static node with miller coupling to high frequency nodes, in accordance with an embodiment.
Figure 10:
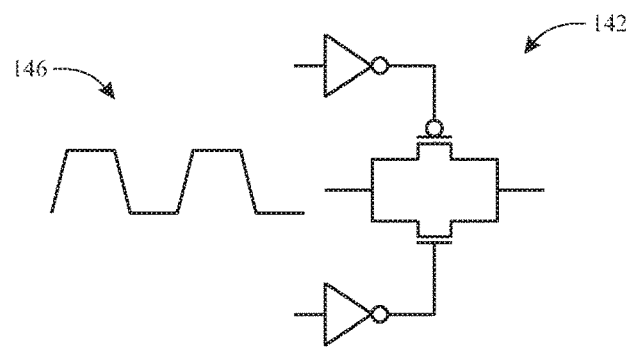
FIG. 10 is an illustration of a technique for determining a resistance specification for a static node (or net) with miller coupling to high frequency nodes, in accordance with an embodiment.

FIGS. 9 and 10 are illustrations of a first technique 140 and a second technique 142, respectively, for determining a resistance specification for a static node with miller coupling to high frequency nodes, in accordance with an embodiment. In certain embodiments, a transistor may include a miller coupling capacitance component from drain to gain and from source to gate. In certain situations where the frequencies of the drain/source nodes are high and/or the frequencies of the risetimes/falltimes are small, a substantial charge may be injected into the gate node, thereby causing a momentary degradation in Vgs. For high frequency circuits (e.g., high frequency circuits 144, 146), these situations may lead to badly shaped signal waveforms and/or excessive signal jitter. Accordingly, it may be beneficial to keep the wiring resistance to the gate low to avoid performance disparity between prelayout and postlayout simulations.

In certain embodiments, high frequency nodes may be identified when a node or net is connected to a gate of the transistor and any drain, source, or gate of that transistor is toggling above a user defined frequency. For high frequency nodes, the wiring resistance may be provided via a lookup table and/or an empirical formula. Specifically, the lookup table and/or empirical formula may be based on a transistor type (e.g., type of transistor may be provided by the foundry), a drain/source frequency, and a transistor gate width. The wiring resistance for high frequency nodes may be described as:

$$R\_wire\_spec = wire\_to\_nonwire\_resistance\_ratio * F(\text{transistor gate width, drain/source frequency, transistor type}) \quad \text{(Equation 12)}$$

As noted above, the F(,,) may be the lookup table and/or the empirical function and the transistor type may be a type of transistor provided by the foundry. In particular, the lookup table or empirical function may be designed so that at high frequencies, the transistor that is responsible for buffering the gate control signal may be equivalent in size with the high frequency toggling transistor. For example, at high frequencies, the control signal must not be weakly held but be driven by a transistor with the same size as the toggling transistor.

Figure 11:
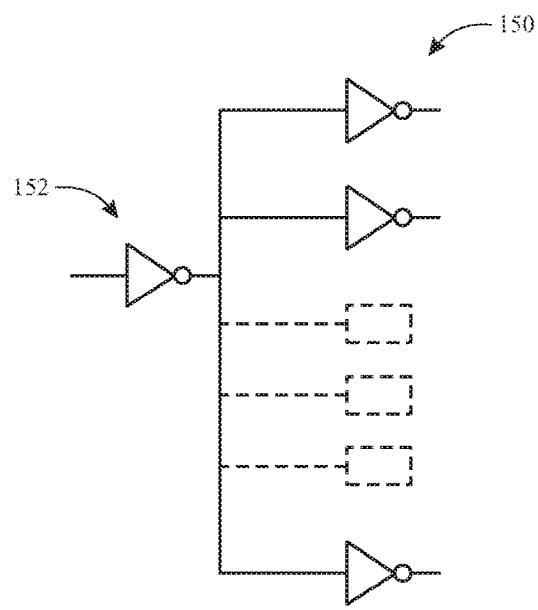
FIG. 11 is an illustration of a technique for determining a resistance specification for a static node (or net) tied to a large fanout, in accordance with an embodiment.
Figure 12:
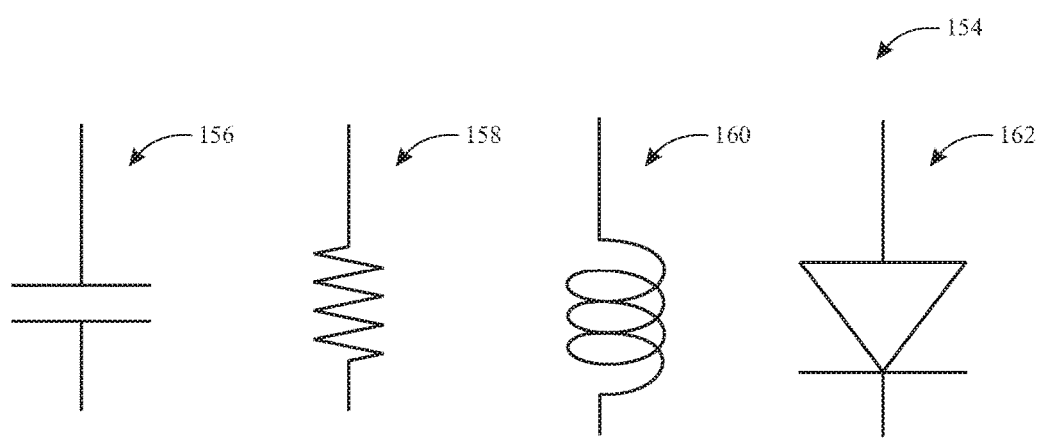
FIG. 12 is an illustration of a technique for determining a resistance specification for a static node (or net) tied to passive elements, precision diodes, and precision resistors, in accordance with an embodiment.

FIG. 11 is an illustration of a technique for determining a resistance specification for a static node tied to a large fanout, in accordance with an embodiment. In certain embodiments, a signal may be static but may be driven by a large inverter and/or buffer. Accordingly, the net resistance may need to be a reasonable value so that the driver is not rendered ineffective. In certain embodiments, a large fanout 152 may be identified when a large Z of a transistor drain/source are attached to net and a large capacitance is measured on the net. The wiring resistance for the large fanout 152 may be described as:

$$R\_wire\_spec\_comp = look\_up\_table\_or\_empirical\_formula(Z\_drain\_or\_source, C\_net) \quad \text{(Equation 13)}$$

As noted above, the F(,,) may be the lookup table and/or the empirical function. Specifically, in certain embodiments, the lookup table and/or empirical formula may be based on the Z of the drain or source and the capacitance measured on the net.

FIG. 11 is an illustration of a technique 154 for determining a resistance specification for a static node tied to passive elements, precision resistors, and precision diodes, in accordance with an embodiment. Specifically, the illustrated embodiment depicts a large capacitor 156, a precision resistor 158, an inductor 160, and a diode 162. These components may be utilized in analog circuitry. Specifically, in certain embodiments, the capacitor 156 may also be utilized for power/ground integrity purposes (to maintain stable power and ground rails. Indeed, it may be beneficial to determine a wiring resistance for these components, and minimize the performance disparity between prelayout and postlayout simulation.

In certain embodiments, the wiring resistance for the capacitor 156 may be provided by an empirical function or lookup table, and may be described as:

$$R\_wire\_spec\_comp(cap) = empirical\_function(capacitance, frequency of net) \quad \text{(Equation 14)}$$

In certain embodiments, the lookup table or empirical function may be designed such that the ratio of the wiring resistance to the capacitive reactance is below a user defined limit (e.g., 0.1 or 10%). In certain embodiments, the wiring resistance specification is simply defined by a tolerance ratio (e.g. (e.g., tolerance ratio of approximately 5%, 10%, 15%, etc.). In certain embodiments, the wiring resistance for the precision resistor 158 may be defined by a tolerance ratio (e.g., tolerance ratio of approximately 5%, 10%, 15%, etc.), and may be described as:

$$R\_wire\_spec\_comp(\text{precision resistor}) = user\ defined\ ratio/degradation/guardband * resistance \quad \text{(Equation 15)}$$

In certain embodiments, the wiring resistance for the inductor 160 may be provided by an empirical function or lookup table, and may be described as:

$$R\_wire\_spec\_comp(inductor) = empirical\_function(inductance, frequency of net) \quad \text{(Equation 16)}$$

In certain embodiments, the wiring resistance for the diode 162 may be provided by an empirical function or lookup table, and may be described as:

$$R\_wire\_spec\_comp(diode) = empirical\_function(diode\ area, diode\ perimeter) \quad \text{(Equation 17)}$$

Figure 13:
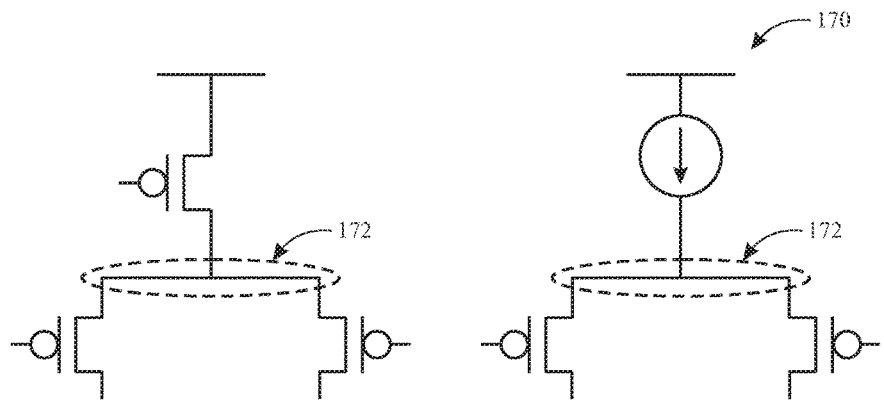
FIG. 13 is an illustration of a technique for determining a resistance specification for a current source node (or net), in accordance with an embodiment.

FIG. 13 is an illustration of a technique 170 for determining a resistance specification for a current source node, in accordance with an embodiment. In certain embodiments, it may be beneficial to determine a resistance specification for a constant current source. Typically, current sources may require small wiring resistances for the common node 172. Specifically, a small degradation in the Vgs of the transistors in the differential pair may result in a significant degradation in gain performance. Accordingly, it may be beneficial to reduce the performance disparity between prelayout and postlayout simulations.

In certain embodiments, the current source node may be identified by the following conditions: (i) if the ratio of the peak current entering/exiting the net versus the average current entering/exiting the net is close to 1, the node is likely to be a constant current source node; and (ii) if the voltage fluctuation or swing on the node/net is close to 0, is also likely to be a constant current source node. When both conditions are met, the processor 18 may be configured to determine the node as a current source node, and may process the wiring resistance appropriately.

In certain embodiments, the designer may specify an allowable Vgs degradation limit, and this limit may be equivalent to the IR drop. For example, if the Vgs degradation limit is set to 25 mV, then the wiring resistance may be given by 25 mV/Iaverage of sum of currents flowing into net or 25 mV/Iaverage of sum of currents flowing out of net. Specifically, the wiring resistance for the constant current source node when the Vgs degradation limit is set to 25 mV may be described as one of:

$$R\_wire\_spec\_cur\_src = 25\ mV/(I_{ave\_into\_net})$$

$$R\_wire\_spec\_cur\_src = 25\ mV/(I_{ave\_out\_of\_net}) \quad \text{(Equation 18)}$$

It should be noted that in other embodiments, the Vgs degradation limit may be changed based on a designer or user preference.

Figure 14:
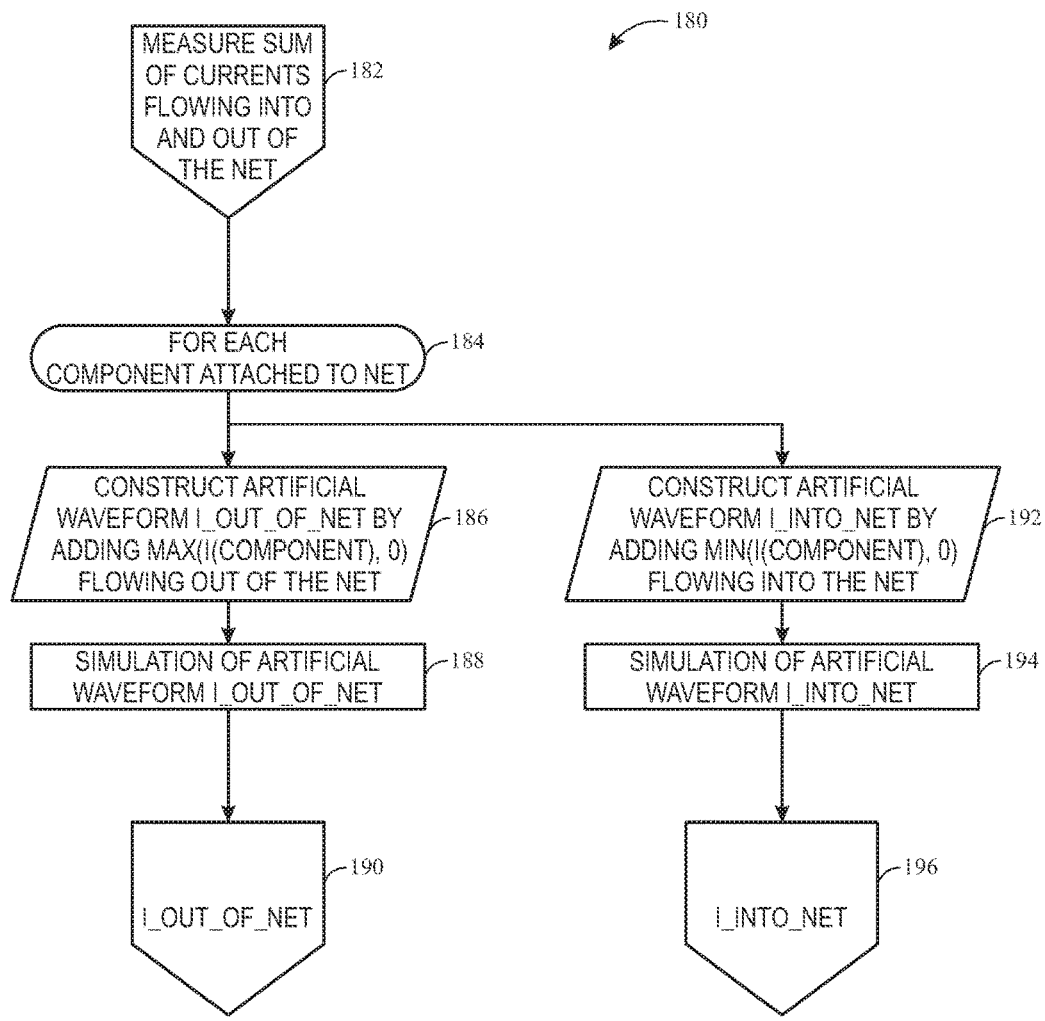
FIGS. 14 and 15 are a flowchart depicting a process for extracting average current, rms current, and peak current for a node (or a net) from prelayout simulations, in accordance with an embodiment.
Figure 15:
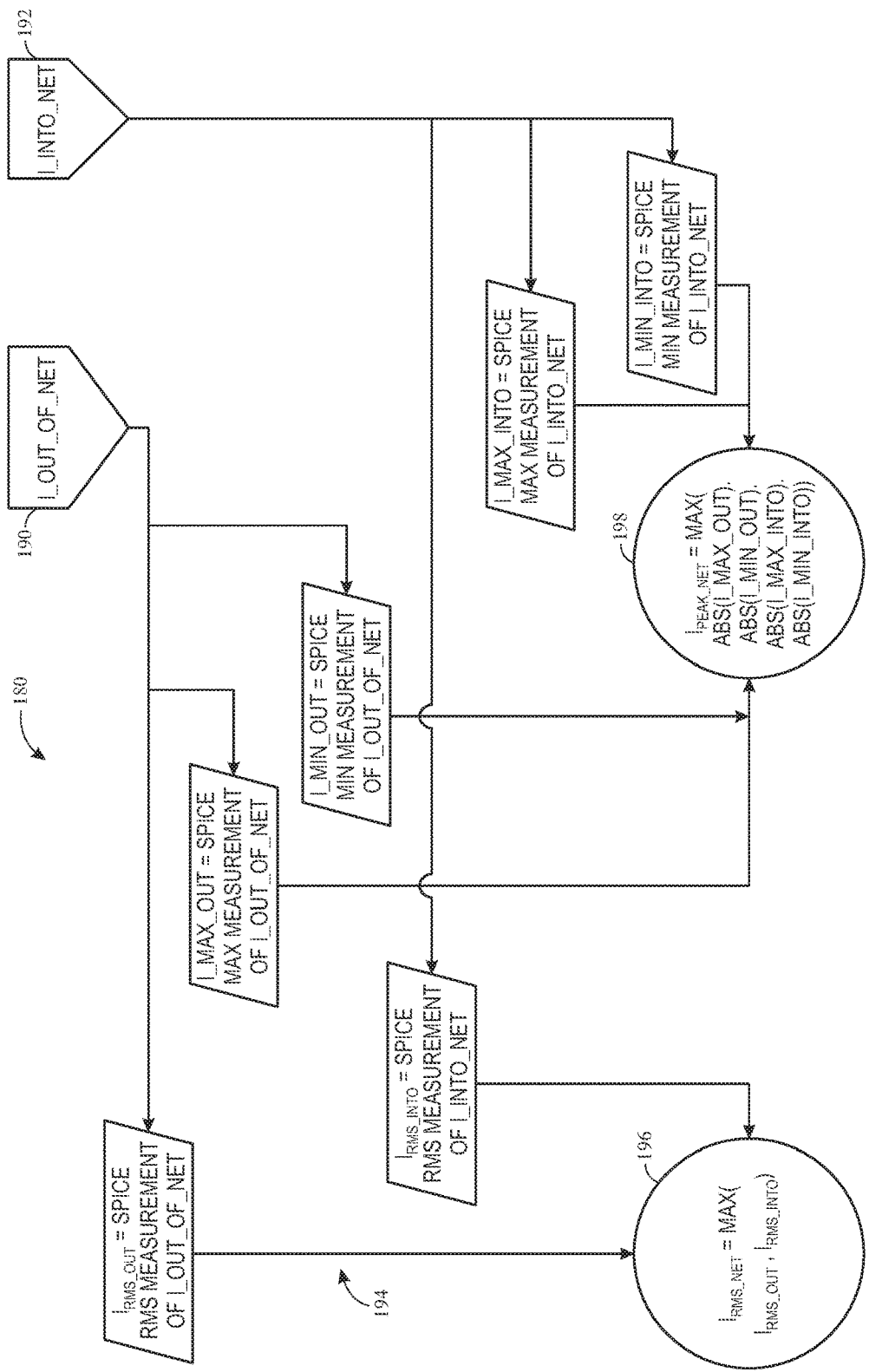

FIGS. 14 and 15 are flowcharts depicting a process 180 for extracting average current, rms current, and peak current from prelayout simulations, in accordance with an embodiment. As noted above, various electrical specifications may be extracted from prelayout simulations to reduce cycles of design iterations during a layout design phase. In certain embodiments, average current, rms current and peak current may be extracted and utilized to budget for metal wiring tracks that comply with various electromigration and self-heating considerations. Specifically, over the course of drawing a layout, designers (e.g., layout designers) may connect several pins together with a wiring net. Accordingly, it may be beneficial to sum the currents flowing into or out of the wiring net, and the summed current may then be utilized to predict how many metal tracks are needed to comply with various electromigration and self-heating requirements.

With the foregoing in mind, the process 180 may include measuring a sum of currents flowing into and out of the net (block 182) for each component attached to the net (block 184). In certain embodiments, the processor 18 may be configured to generate artificial current waveform constructs which add up all the currents flowing into the net and out of the net constructively before simulating the average/rms/peak current measurements. Accordingly, in certain embodiments, the process 180 may include constructing an artificial waveform (e.g., I_out_of_net) by adding the current of each component flowing out of the net (block 186), and simulating the artificial waveform (block 188) to determine the final I_out_of_net (block 190). The max current can then be determined from I_out_of_net. Further, the process 180 may include constructing an artificial waveform (e.g., I_into_net) by adding the current of each component flowing into the net (block 192), and simulating the artificial waveform (block 194) to determine the final I_into_net (block 196). The min current can then be determined from I_into_net.

In certain embodiments, based on the final I_out_of_net (block 190) and final I_into_net (block 192), the process 180 may utilize one or more steps 194 to determine the final rms current (block 196) and peak current (block 198). It should be noted that the process 180 may be configured to determine a worst case rms current and/or peak current for the net, thereby providing a worst case scenario of current crowding. In certain embodiments, the extracted electrical specification information related to average current, rms current, and peak current may be utilized to arrange a layout of transistors, as further described with respect to FIGS. 16 and 17.

Figure 16:
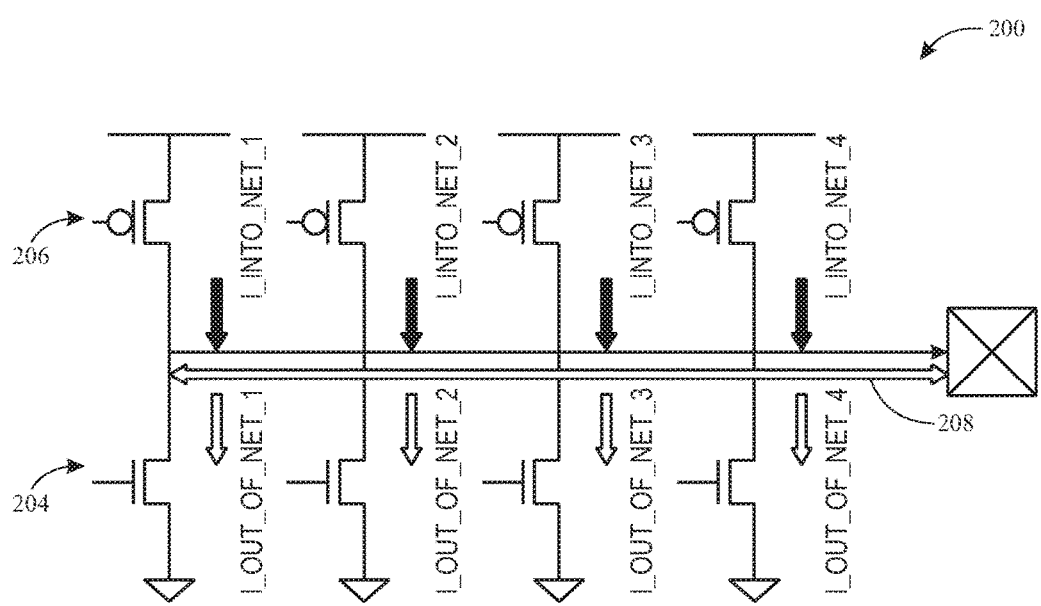
FIG. 16 is a block diagram of an embodiment of transistors arranged such that the average current extracted in FIG. 15 is minimized for a node (or net), in accordance with an embodiment.
Figure 17:
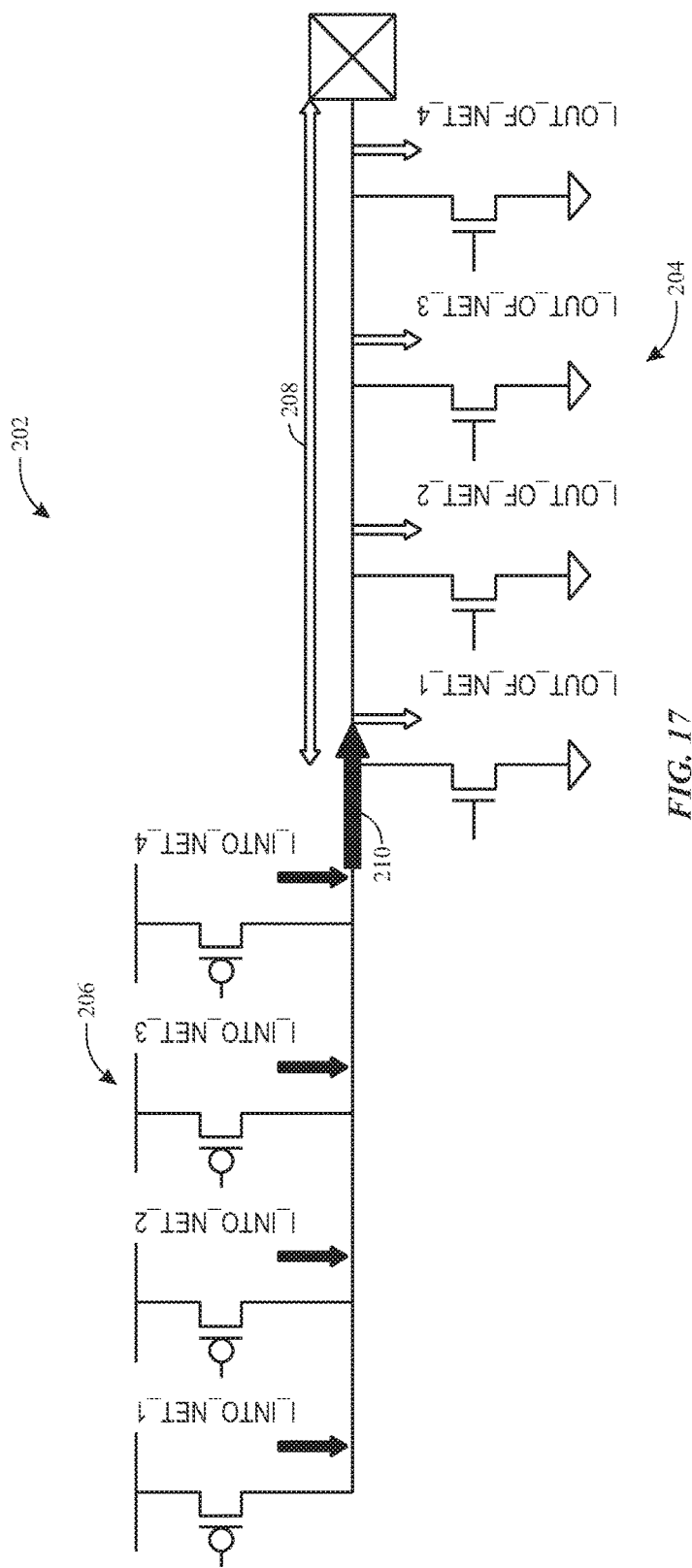
FIG. 17 is a block diagram of an embodiment of transistors arranged such that the average current extracted in FIG. 15 is maximized for a node (or net), in accordance with an embodiment.

FIG. 16 is a block diagram of a first embodiment 200 of arranging transistors based on the average current, rms current, and peak current extracted through prelayout simulations, in accordance with an embodiment. Further, FIG. 17 is a block diagram of a second embodiment 202 of arranging transistors based on the extracted average current, rms current, and peak current.

Specifically, in certain embodiments, such as in the first embodiment 200, the nMOS transistors 204 may be arranged directly below the pMOS transistors 206, and the wire segment 208 may have zero average current. As a result, in such embodiments, the designer may only need to design to meet the rms current or self-heating current limit. Further, in certain embodiments, such as the second embodiment 202, the nMOS transistors 204 may be arranged to the right of the pMOS transistors 206, and the currents from the pMOS transistors 206 may all converge to a point 210. In such embodiments, the wire segment 208 may suffer from current crowding. Accordingly, the designer may, therefore, design for a high average current and allocate enough metal tracks to meet the average and/or electromigration current limit.

In this manner, the electrical specification information extracted from prelayout simulations (e.g., average current, rms current, and peak current) may be utilized by the designer (e.g., layout designer) to develop one or more physical arrangements of transistors (e.g., nMOS and pMOS transistors 204, 206) on circuitry.

Figure 18:
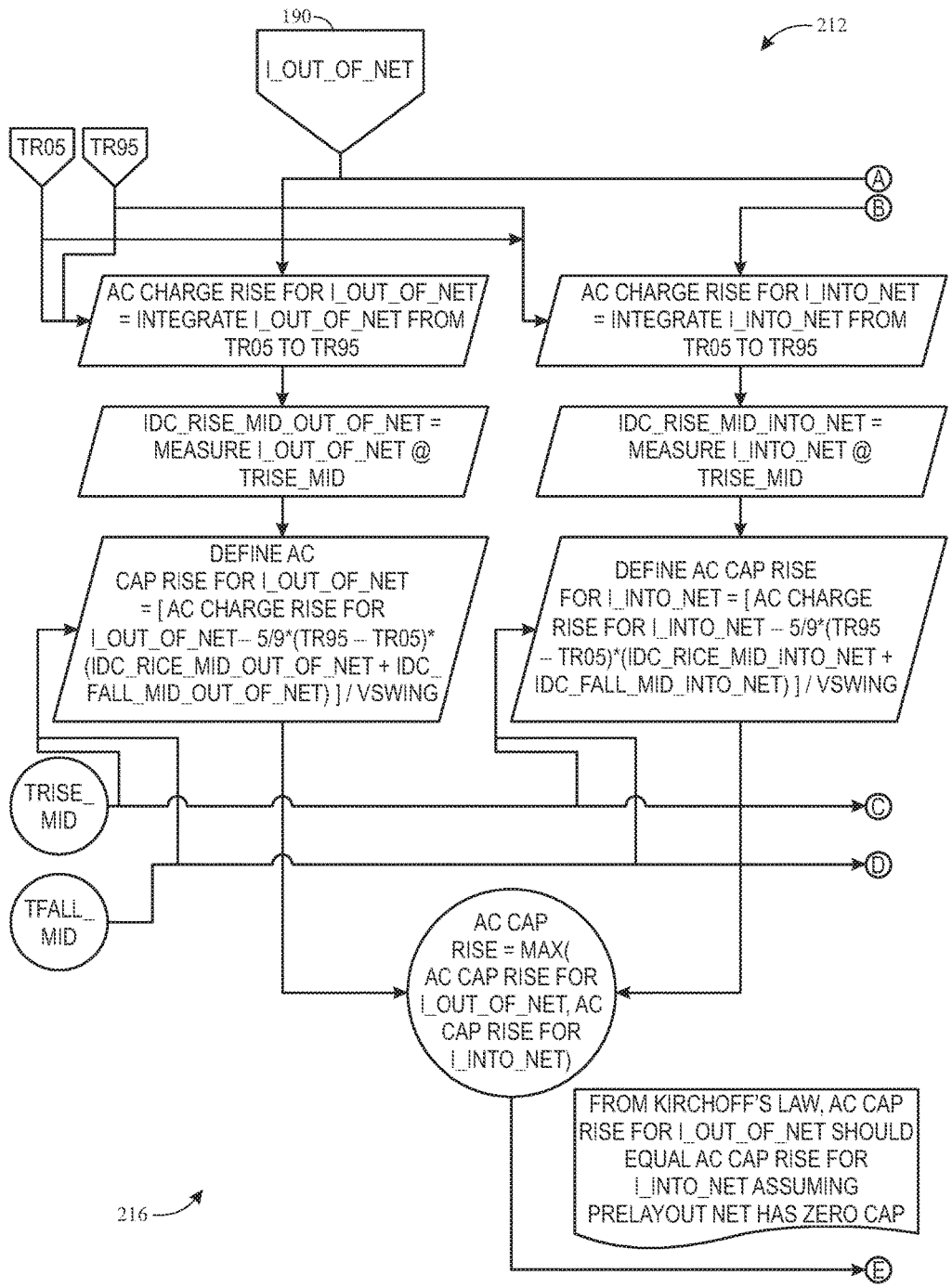
FIGS. 18 and 19 are a flowchart depicting a process for determining a capacitance specification, in accordance with an embodiment.
Figure 19:
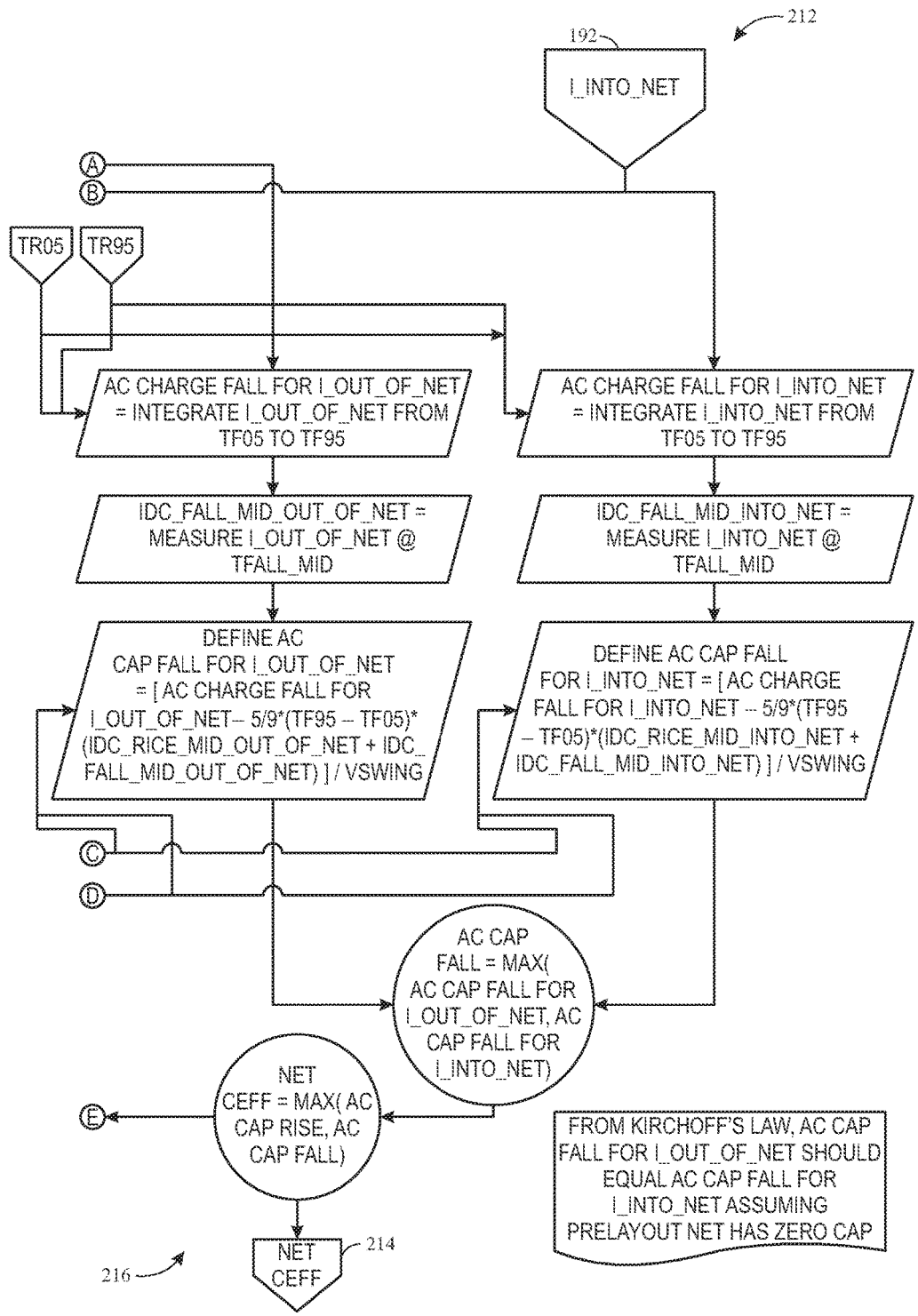

FIGS. 18 and 19 are a flowchart depicting a process 212 for determining a capacitance specification 214, in accordance with an embodiment. Specifically, in certain embodiments, the capacitance specification may be extracted from prelayout simulations by measuring a total charge transferred into or out of the node/net during rising and falling transitions of the waveform. In particular, a capacitance specification extracted in this manner may reflect all the capacitances encountered downstream. With the foregoing in mind, the process 212 may utilize the I_out_of_net (block 190) and I_into_net (block 192) to derive an effective capacitance (block 214) with one or more processing steps 216.

Figure 20:
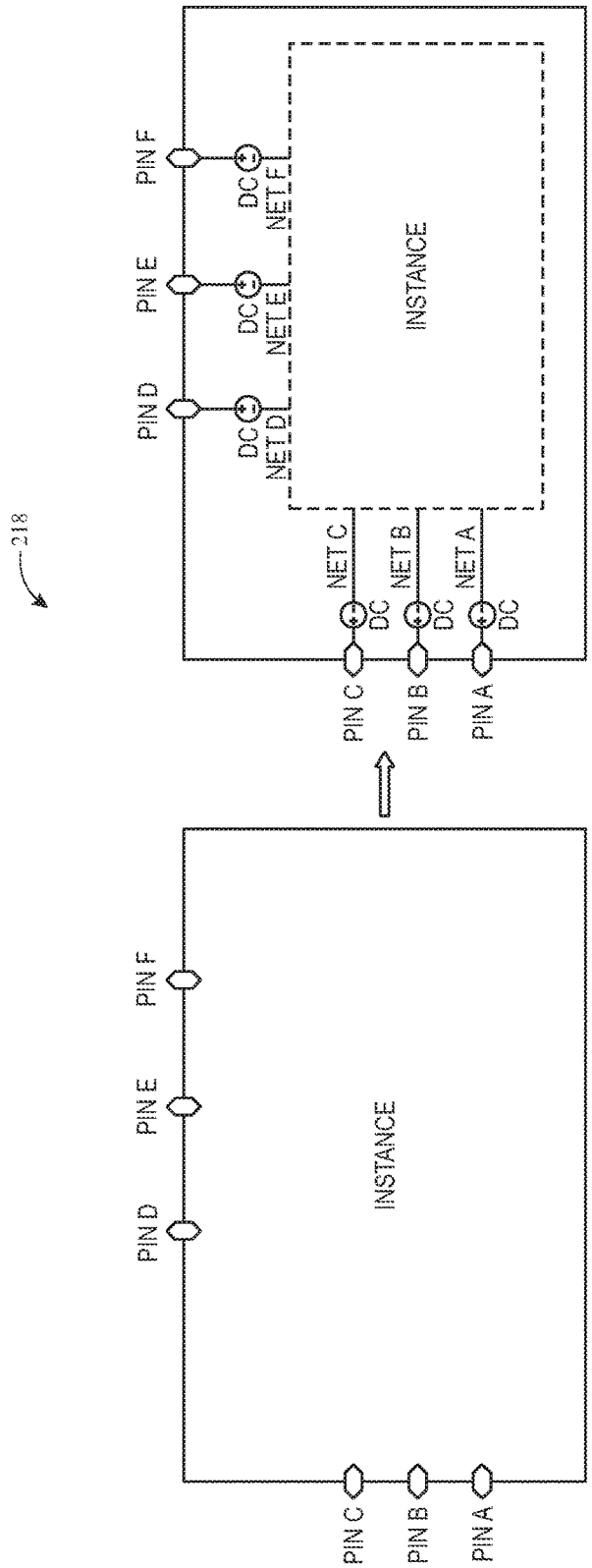
FIG. 20 is a block diagram of an embodiment for deriving pin resistance and capacitance with the process of FIGS. 18 and 19, in accordance with an embodiment.

FIG. 20 is a block diagram 218 of an embodiment for deriving pin resistance capacitance. In certain embodiments, the pin resistance capacitance may be derived utilizing the systems and methods described in FIGS. 1-19, in accordance with an embodiment. In particular, in the illustrated embodiment, techniques described in FIGS. 1-19 may be utilized to insert perfect voltages between the pin (e.g., pin A, pin B, pin C, pin D, Pin E, or Pin F) and the component. In this manner, a new node (or net) associated with the pin may be created (e.g., Net A, Net B, Net C, Net D, Net E, or Net F), and the derivation of the wire resistance capacitance specifications for the new node (or net) may be determined utilizing the techniques described in FIGS. 1-19.

Figure 21:
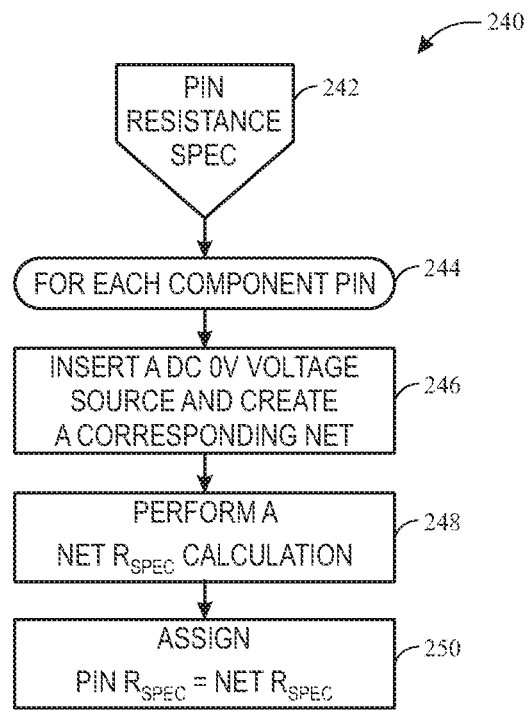
FIG. 21 is a flowchart depicting a process for determining a pin resistance with the process of FIGS. 18 and 19, in accordance with an embodiment.

FIG. 21 is a flowchart depicting a process 240 for determining a pin resistance (e.g., Pin Rspec) (block 242) with the process of FIGS. 18 and 19, in accordance with an embodiment. Specifically, the process 240 may include, for each component pin (block 244), inserting a DC 0V voltage source to create a corresponding net (block 246). Further, the process 240 may include performing a Net Rspec calculation (block 248) and assigning Pin Rspec with the calculated Net Rspec (block 250).

Figure 22:
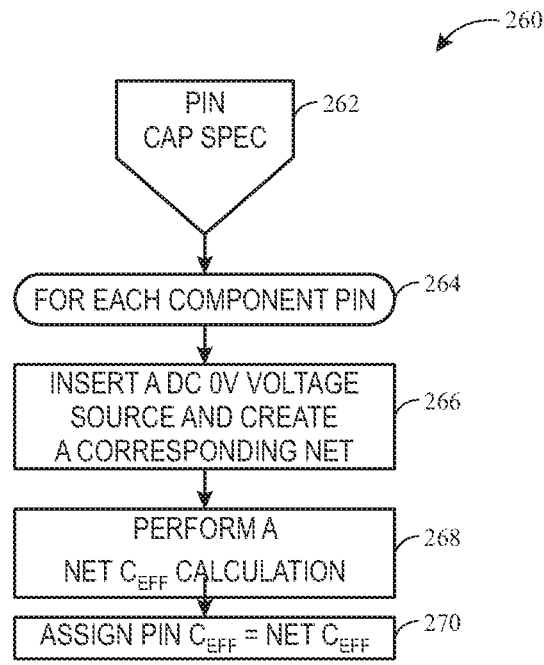
FIG. 22 is a flowchart depicting a process for determining a pin capacitance with the process of FIGS. 18 and 19, in accordance with an embodiment.
Figure 23A:
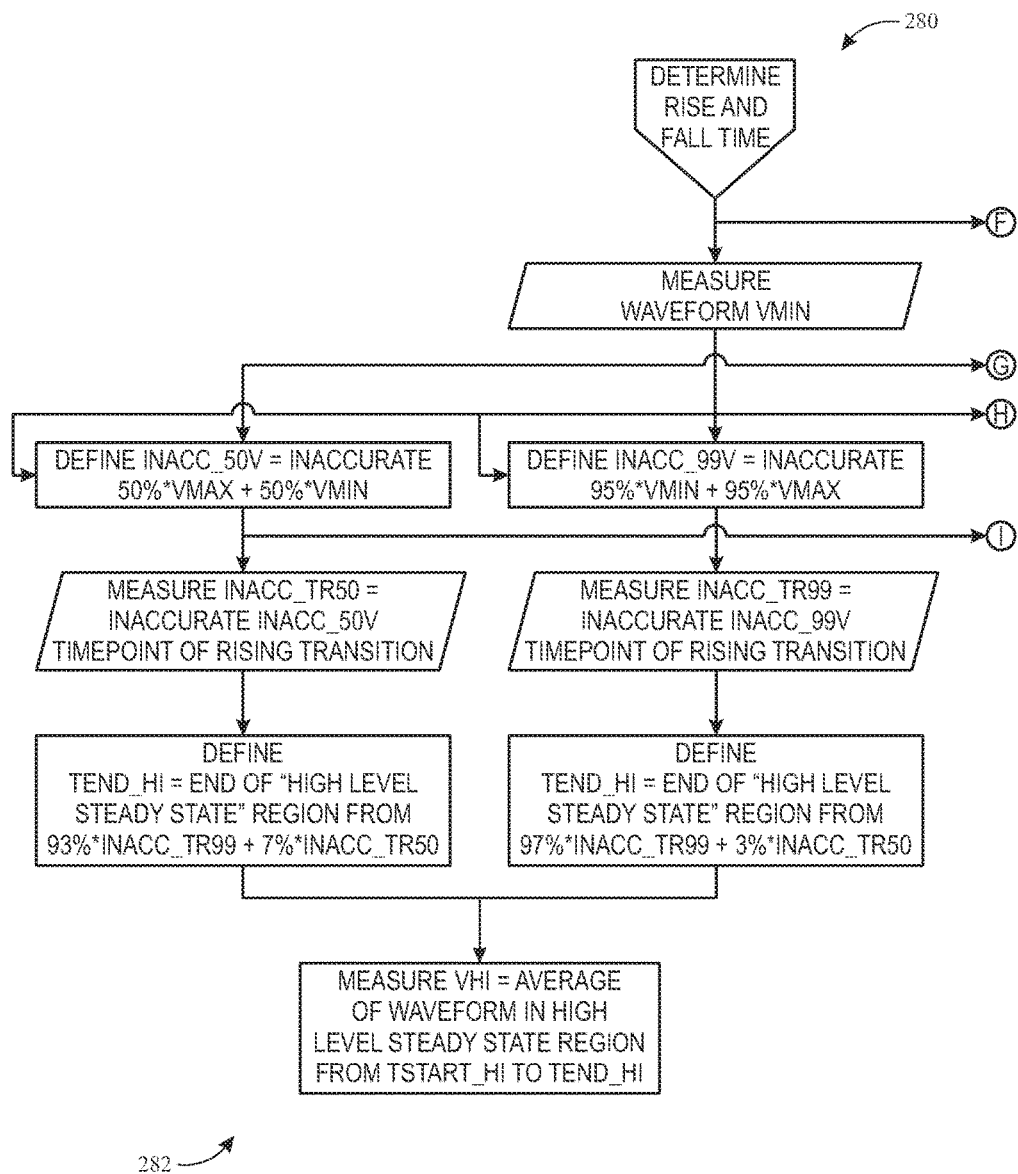
FIGS. 23A, 23B, 24A, and 24B are a flowchart depicting a process 280 for measuring risetimes and falltimes, in accordance with an embodiment.
Figure 23B:
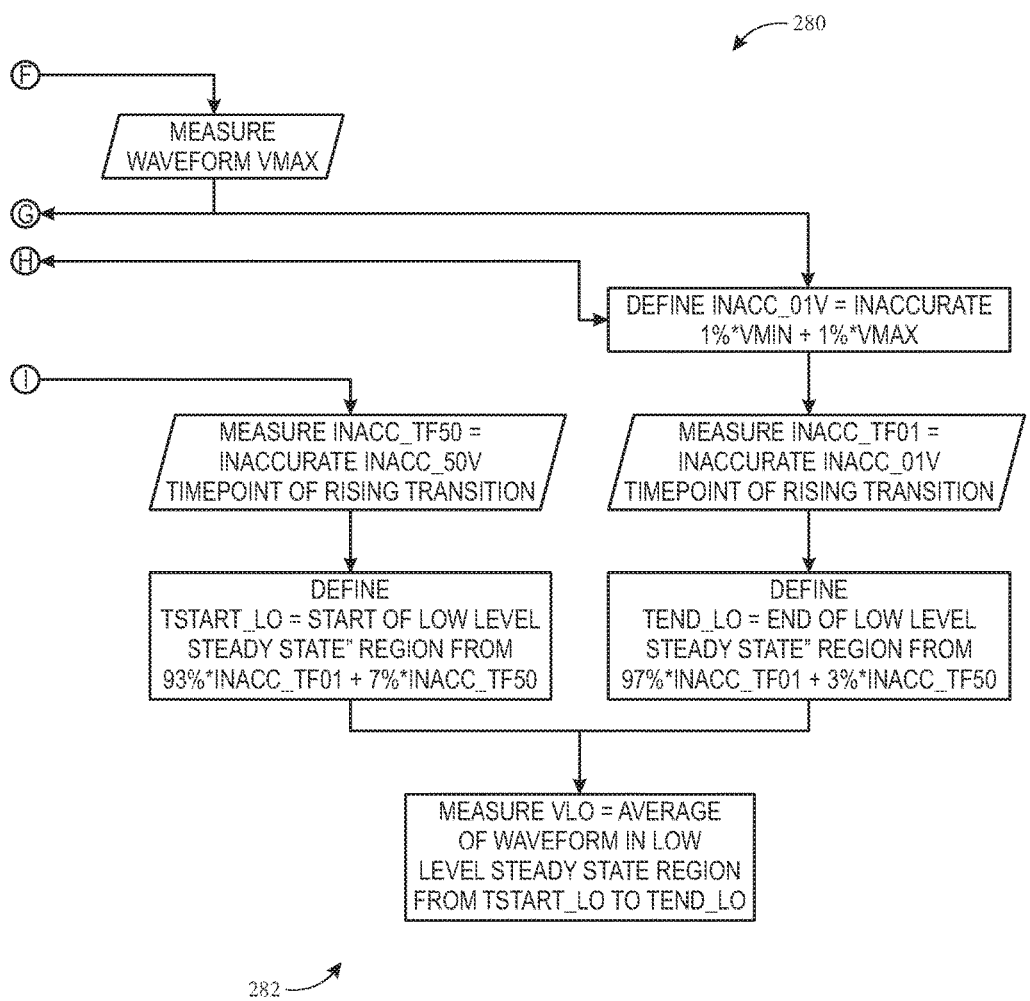
Figure 24A:
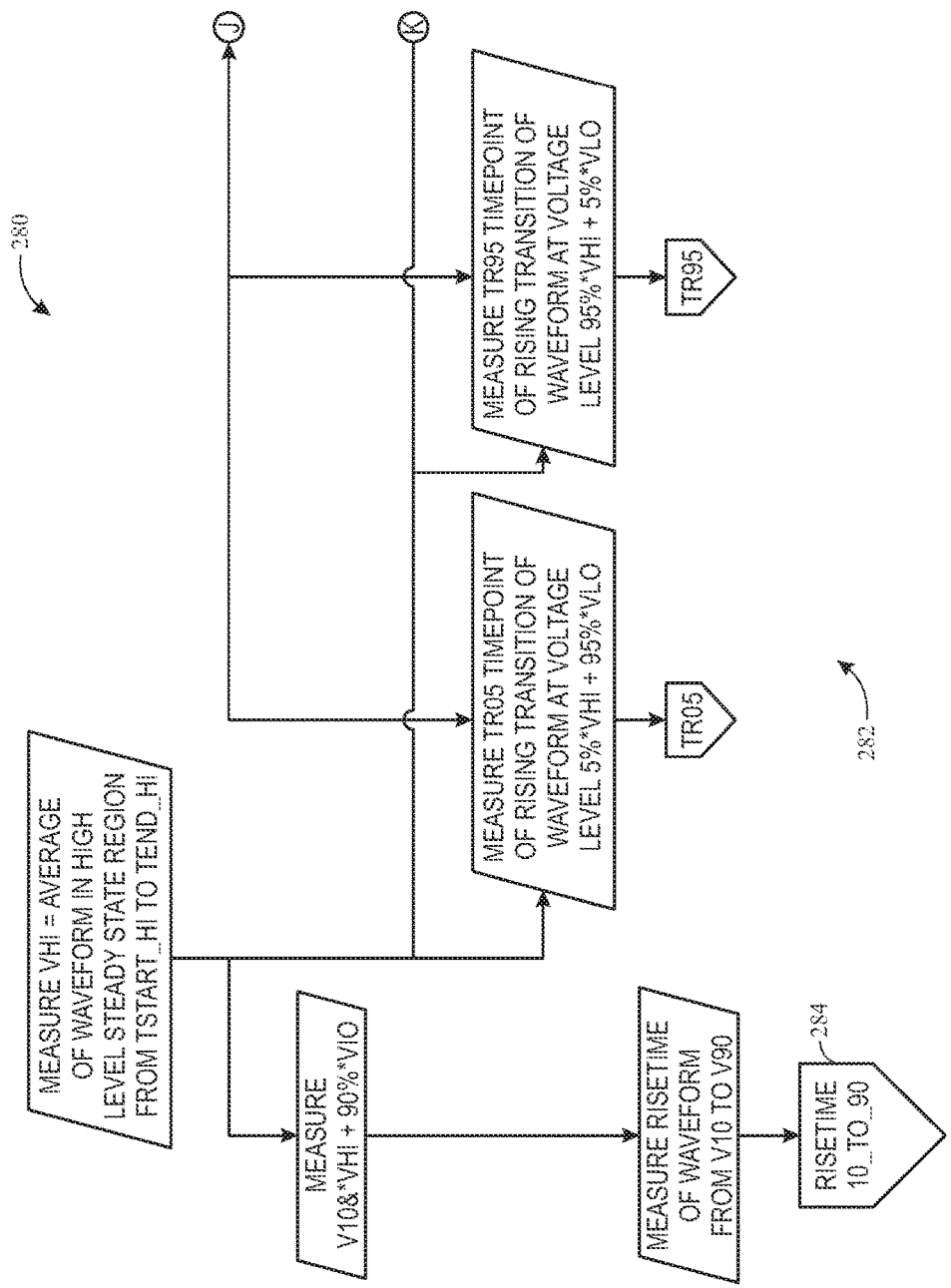
Figure 24B:
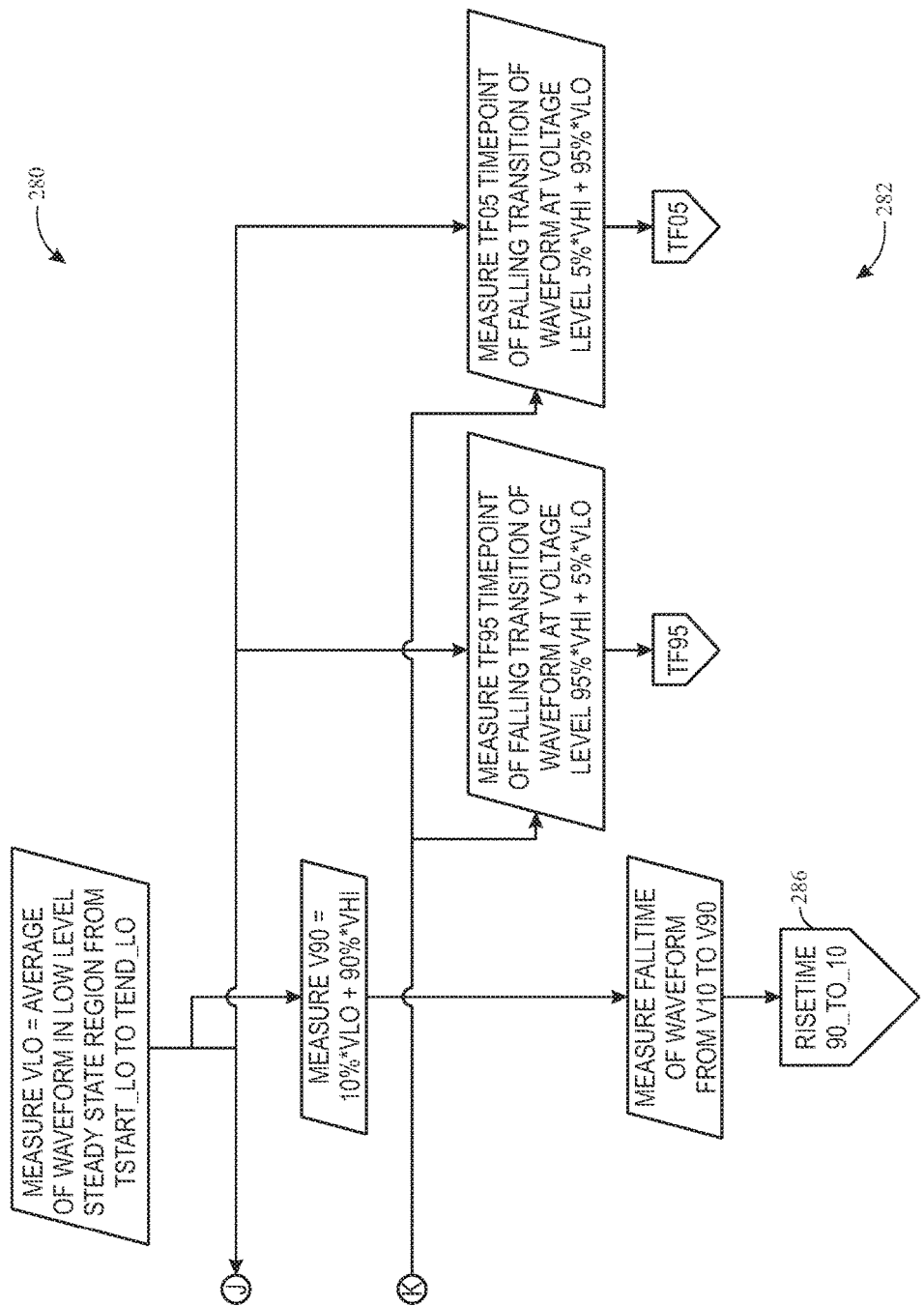

FIG. 22 is a flowchart depicting a process 260 for determining a pin capacitance (e.g., Pin Cap Spec) (block 263) with the process of FIGS. 18 and 19, in accordance with an embodiment. Specifically, the process 260 may include, for each component pin (block 264), inserting a DC 0V voltage source to create a corresponding net (block 266). Further, the process 260 may include performing a Net Ceff calculation (block 268) and assigning Pin Ceff with the calculated Net Ceff (block 270).

FIGS. 23A, 23B, 24A, and 24B are flowcharts depicting a process 280 for measuring risetimes and falltimes, in accordance with an embodiment. Specifically, the process 280 may be utilized to correct for waveforms that tend to overshoot and undershoot. Accordingly, the process 280 may include one or more processing steps 282 to determine a risetime 284 (e.g., risetime 10_to_90) and a falltime 286 (e.g., falltime 90_to_10). Specifically, as noted above with respect to FIG. 5, in certain embodiments, the risetime may be defined as the time taken for the signal to traverse from the 10% point to the 90% point. Likewise, the falltime may be defined as the time taken for the signal to traverse from the 90% point to the 10% point.

Figure 25:
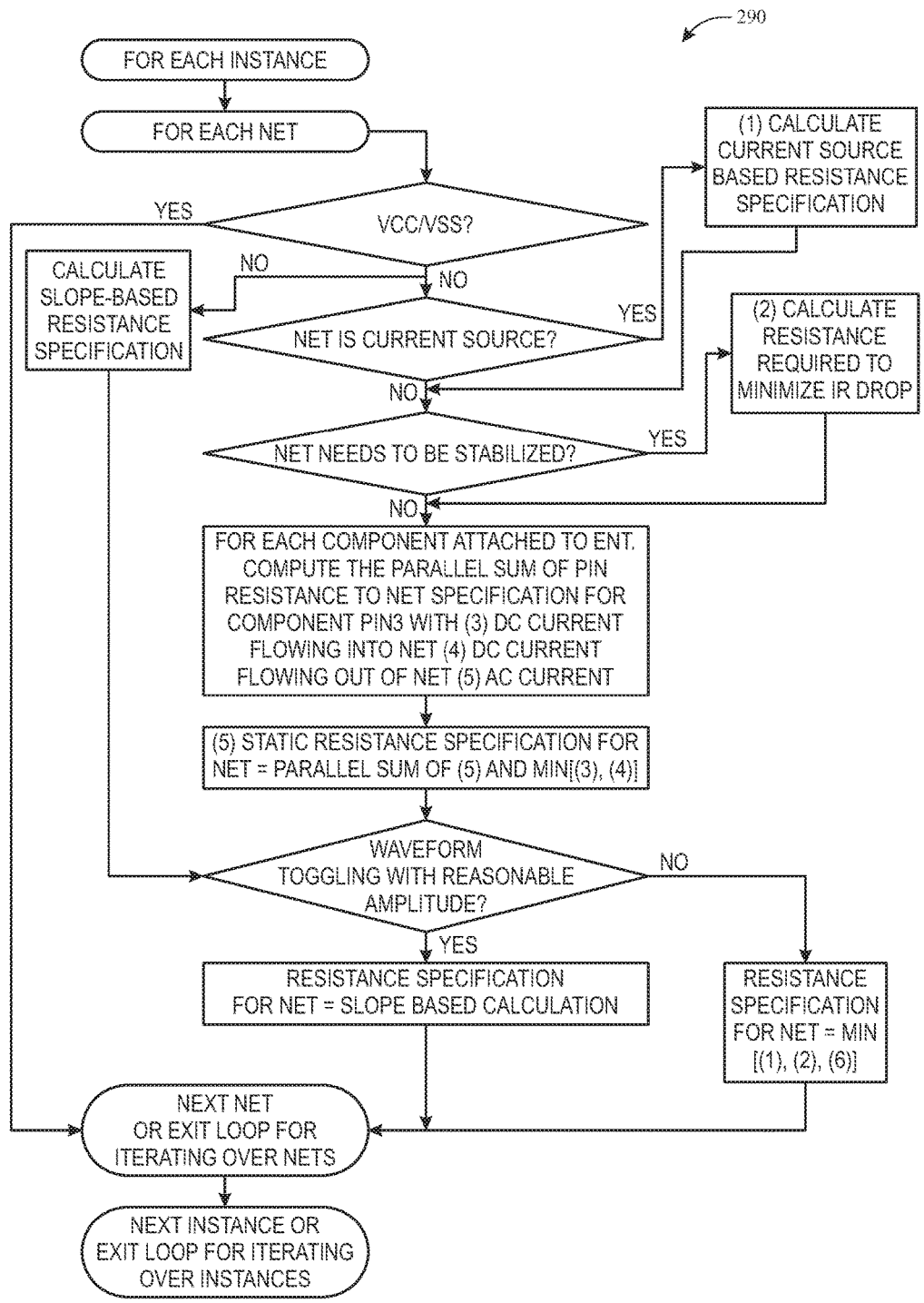
FIG. 25 is a flowchart depicting pseudo-code for computing the resistance specification via the processor of FIG. 1, in accordance with an embodiment.
Figure 26:
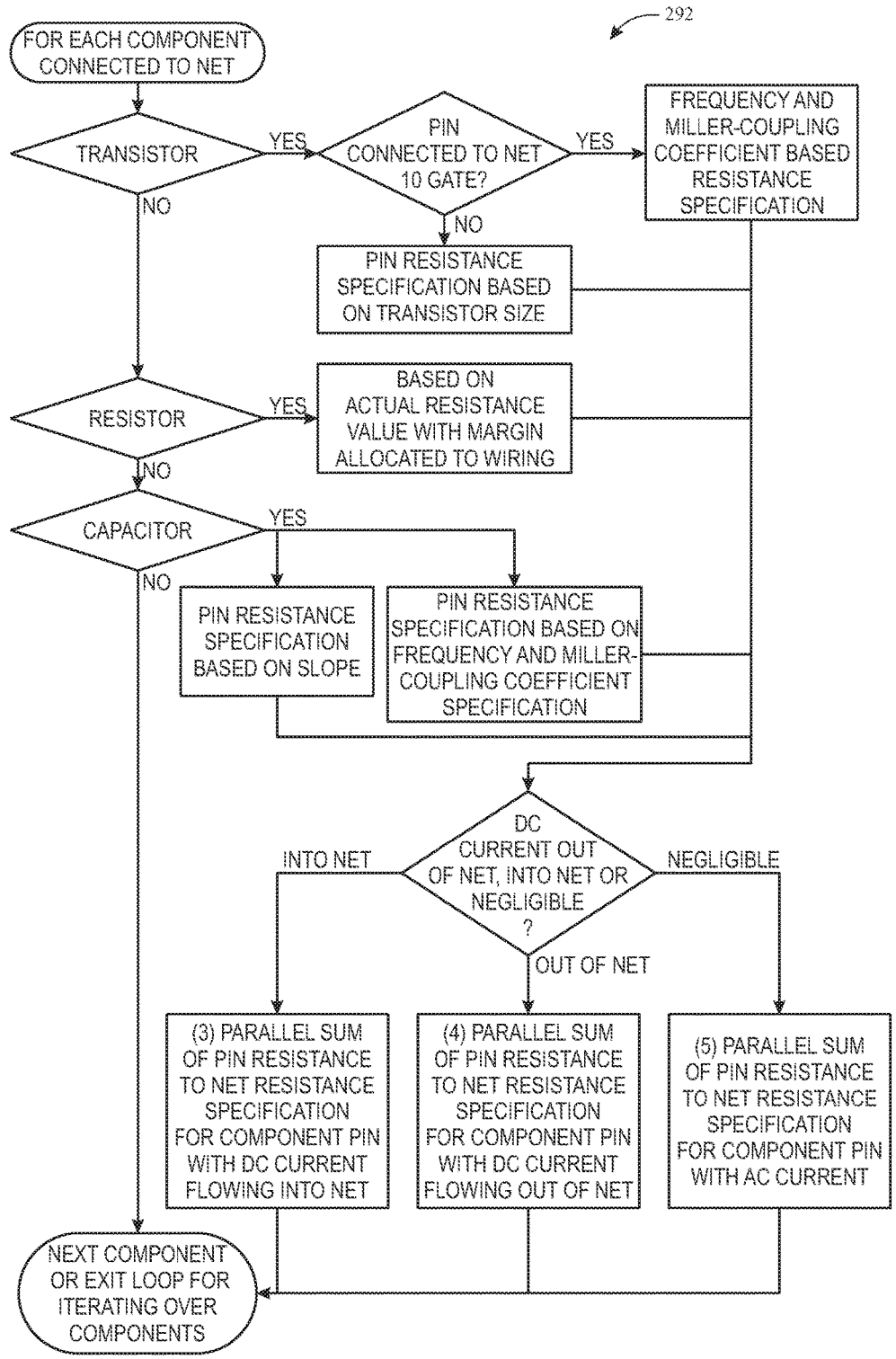
FIG. 26 is a flowchart depicting pseudo-code for computing the resistance specification for static nodes via the processor of FIG. 1, in accordance with an embodiment.

FIG. 25 is a flowchart 290 depicting pseudo-code for computing the resistance specification via the processor 18 of FIG. 1, in accordance with an embodiment. FIG. 26 is a flowchart 292 depicting pseudo-code for computing the resistance specification for static nodes via the processor 18 of FIG. 1, in accordance with an embodiment.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method, comprising:
   extracting, via a processor, one or more electrical specifications from a prelayout simulation of an integrated circuit design, wherein extracting the one or more electrical specifications comprises:
      determining a first slope associated with a risetime of a toggling waveform output by a toggling node of the integrated circuit design and a second slope associated with a falltime of the toggling waveform;
      determining a net sum of currents flowing through the toggling node; and
      determining a resistance specification for the toggling node based at least in part on the first slope, the second slope, and the net sum of currents; and
   generating a physical layout of one or more components of an integrated circuit based at least in part on the one or more extracted electrical specifications, wherein the physical layout comprises a floorplan, a routing of wires, or both; and
   fabricating the integrated circuit based at least in part on the physical layout.

2. The method of claim 1, wherein extracting the one or more electrical specifications comprises extracting a net effective capacitance specification based at least in part on the net sum of currents.

3. The method of claim 1, wherein determining the first slope of the risetime comprises determining an amount of time for the toggling waveform to reach 90% of a maximum value of the toggling waveform.

4. The method of claim 1, wherein determining the second slope of the falltime comprises determining an amount of time for the toggling waveform to reach 10% of a maximum value of the toggling waveform.

5. The method of claim 1, wherein determining the net sum of currents flowing through the toggling node comprises summing the currents flowing into and out of the toggling node.

6. The method of claim 1, wherein determining the resistance specification of the toggling node comprises using a final slope equation configured to determine the resistance specification of the toggling node.

7. The method of claim 6, wherein the final slope equation incorporates a first parameter associated with a capacitance guardband percentage, a second parameter associated with a postlayout slope degradation ratio guardband, or a combination thereof.

8. A system, comprising:
   a design system comprising a processor, wherein the design system is configured to:
      extract one or more electrical specifications from a prelayout simulation of an integrated circuit design, wherein the one or more electrical specifications comprises a resistance specification for a static node of the integrated circuit design, wherein the static node is configured to maintain a voltage value within a threshold, and wherein extracting the one or more electrical specifications comprises:
         determining a net sum of currents flowing through the static node;
         determining a voltage drop budget for one or more peak currents, one or more analog current sources, or a combination thereof for the static node, wherein the voltage drop budget is less than the threshold; and
         determining the resistance specification for the static node based at least in part on the net sum of currents and the voltage drop budget; and
      generate an electronic design of a physical layout of an Integrated Circuit (IC) based at least in part on one or more of the extracted electrical specifications; and
   a fabrication system configured to produce the IC based at least in part on the electronic design.

9. The system of claim 8, wherein the physical layout comprises a floorplan or a routing of wires for a field programmable gate array (FPGA).

10. The system of claim 8, wherein the integrated circuit comprises one or more circuit blocks, one or more wires, one or more metal tracks, one or more wiring tracks, or a combination thereof.

11. The system of claim 8, wherein the static node configured to maintain the voltage value within the threshold in response to a current flowing through the static node, wherein the current exceeds a current threshold.

12. The system of claim 8, wherein extracting the one or more electrical specifications comprises determining a miller capacitance requirements of the static node in response to the static node being coupled to a high frequency node via miller coupling, wherein the high frequency node is configured to electrically couple to a transistor toggling above a user defined frequency threshold.

13. The system of claim 8, wherein extracting the one or more electrical specifications comprises determining a resistance specification of a constant current source node based at least in part on an average current, a rms current, a peak current, or a combination thereof of the constant current source node.

14. The system of claim 8, wherein extracting the one or more electrical specifications comprises determining the resistance specification based on a transistor sizing, one or more component pin capacitances, or a combination thereof.

15. The system of claim 8, wherein determining the net sum of currents flowing through the static node comprises summing the currents flowing into and out of the static node.

16. The system of claim 8, wherein the static node is a node configured to electrically couple to two or more circuit components and to be driven by a driver, wherein the driver is an inverter, a buffer, or a combination thereof.

17. The system of claim 8, wherein the static node is configured to electrically couple to one or more passive circuit elements, wherein the passive circuit elements comprise one or more precision resistors, one or more precision diodes, one or more capacitors, one or more inductors, one or more diodes, or any combination thereof.

18. A tangible, non-transitory, computer-readable medium, comprising instructions to:
- extract, via a processor, one or more electrical specifications from a prelayout simulation of an integrated circuit design, wherein extracting the one or more electrical specifications comprises:
  - determining a first total net charge of one or more nodes of the integrated circuit design during a risetime of a toggling waveform;
  - determining a second total net charge of the one or more nodes during a falltime of the toggling waveform; and
  - determining a capacitance specification associated with the one or more nodes based at least in part on the first total net charge and the second total net charge; and
- generate an electronic design of a physical layout of an Integrated Circuit (IC) based at least in part on the one or more extracted electrical specification, wherein the physical layout comprises a floorplan, a routing of wires, or a combination thereof; and fabricate the IC based at least in part on the electronic design.

19. The computer-readable medium of claim 18, wherein determining the first total net charge comprises:
- determining a third total net charge of current flowing out of the one or more nodes during the risetime;
- determining a fourth total net charge of current flowing into the one or more nodes during the risetime; and
- obtaining a maximum charge from the third total net charge and the fourth total net charge.

20. The computer-readable medium of claim 18, wherein determining the second total net charge comprises:
- determining a fifth total net charge of current flowing out of the one or more nodes during the falltime;
- determining a sixth total net charge of current flowing into the one or more nodes during the falltime; and
- obtaining a maximum charge from the fifth total net charge and the sixth total net charge.

* * * * *